US010236874B2

(12) United States Patent
Purcarea et al.

(10) Patent No.: US 10,236,874 B2
(45) Date of Patent: Mar. 19, 2019

(54) OVERVOLTAGE PROTECTION CIRCUIT FOR A POWER SEMICONDUCTOR AND METHOD FOR PROTECTING A POWER SEMICONDUCTOR FROM OVER-VOLTAGES

(71) Applicant: Robert Bosch GmbH, Stuttgart (DE)

(72) Inventors: Calin Purcarea, Stuttgart (DE); Peter Feuerstack, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 314 days.

(21) Appl. No.: 15/032,365

(22) PCT Filed: Oct. 21, 2014

(86) PCT No.: PCT/EP2014/072487
§ 371 (c)(1),
(2) Date: Apr. 27, 2016

(87) PCT Pub. No.: WO2015/062902
PCT Pub. Date: May 7, 2015

(65) Prior Publication Data
US 2016/0269020 A1   Sep. 15, 2016

(30) Foreign Application Priority Data

Oct. 29, 2013   (DE) .................. 10 2013 221 900

(51) Int. Cl.
*H03K 17/56*   (2006.01)
*H02M 1/32*   (2007.01)
(Continued)

(52) U.S. Cl.
CPC ............. *H03K 17/56* (2013.01); *H02H 9/044* (2013.01); *H02M 1/32* (2013.01); *H03K 17/0828* (2013.01)

(58) Field of Classification Search
CPC .... H03K 17/56; H03K 17/0828; H02H 9/044; H02M 1/32
See application file for complete search history.

(56) References Cited

U.S. PATENT DOCUMENTS 4,359,652 A * 11/1982 Jarrett ................ H03K 17/0826
315/209 T
5,818,120 A * 10/1998 Palara .................... F02P 3/0552
307/10.6
(Continued)

FOREIGN PATENT DOCUMENTS

DE        4428675       2/1996
DE        19828658      12/1999
(Continued)

OTHER PUBLICATIONS

International Search Report for Application No. PCT/EP2014/072487 dated Dec. 22, 2014 (English Translation, 3 pages).
(Continued)

*Primary Examiner* — Scott Bauer
(74) *Attorney, Agent, or Firm* — Michael Best & Friedrich LLP

(57) ABSTRACT

The invention relates to an overvoltage protection circuit (5) and a method for protecting a power semiconductor (31, 32) from over-voltages. For this purpose, a voltage applied across a power semiconductor switch is first converted to a lower voltage signal corresponding to the voltage applied to the power semiconductor switch by means of a resistance voltage divider. The reduced voltage signal is then evaluated by means of an overvoltage detector, such as a Zener or suppression diode, and the power semiconductor switch to be protected is activated if the response voltage of said diode is exceeded. By lowering the voltage level by means of a voltage divider, a Zener or suppression diode having a lower voltage level can be used for monitoring the overvoltage, (Continued)

said Zener or suppression diode having improved operating properties in comparison with corresponding diodes having a higher voltage level.

9 Claims, 9 Drawing Sheets

(51) Int. Cl.
*H03K 17/082* (2006.01)
*H02H 9/04* (2006.01)

(56) References Cited

U.S. PATENT DOCUMENTS

| | | |
|---|---|---|
| 6,087,877 A | 7/2000 | Gonda et al. |
| 2003/0042939 A1 | 3/2003 | Kato et al. |
| 2005/0179463 A1 | 8/2005 | Kasuya et al. |
| 2011/0110007 A1* | 5/2011 | Ting .................. H02M 1/32 |
| | | 361/91.1 |
| 2012/0236456 A1 | 9/2012 | Yu |

FOREIGN PATENT DOCUMENTS

| | | |
|---|---|---|
| DE | 102010008815 | 8/2011 |
| EP | 0206505 | 12/1986 |
| EP | 0757443 | 2/1997 |
| GB | 1344136 | 1/1974 |

OTHER PUBLICATIONS

Kim et al., "Active Clamping Circuit to Suppress Switching Stress on a MOS-Gate-Structure-Based Power Semiconductor for Pulsed-Power Applications," IEEE Transactions on Plasma Science, IEEE, Service Center, Jiscataway, NJ, US, vol. 39, No. 8, Aug. 1, 2011, pp. 1736-1742.

* cited by examiner

OVERVOLTAGE PROTECTION CIRCUIT FOR A POWER SEMICONDUCTOR AND METHOD FOR PROTECTING A POWER SEMICONDUCTOR FROM OVER-VOLTAGES

BACKGROUND OF THE INVENTION

The present invention relates to an overvoltage protection circuit for a power semiconductor and a method for protecting a power semiconductor from over-voltages.

Power switches on the basis of semiconductor switches are known. Because such power semiconductor switches do not have any moving mechanical parts, they ensure a wear-free operation with very short switching times over a long period of time. Bipolar transistors with an insulated gate (IGBT) or metal-oxide-semiconductor field-effect transistors (MOSFET) are, for example, used as such power semiconductor switches. In order to protect these transistors, the power semiconductor switches are additionally equipped with a free-wheeling diode. Because the dielectric strength of such power semiconductor switches is limited, additional circuit means have to be in place in order to ensure that the voltage between input and output of the power semiconductor switch is always less than a so-called breakdown voltage. If the voltage between the terminals of the power semiconductor switch rises above said breakdown voltage, there is then the danger of the power semiconductor switch being destroyed. This destruction of said power semiconductor switch is irreversible.

So-called Zener diodes or also suppression diodes are therefore used in order to protect the power semiconductor switch from such dangerous over-voltages. Should, for example, an overvoltage spike occur due to an interrupted current flow in a load inductor, the corresponding power semiconductor switch is actively activated if the breakdown voltage of the Zener or suppression diode is exceeded. In so doing, a renewed current flow through the power semiconductor switch is possible, whereby the voltage spike is limited to a safe value. In addition, a controller is often situated in the circuit which limits a voltage at the output via an intervention into the control voltage of the power semiconductor switch. Such a controller has, however, low dynamics so that short overvoltage spikes cannot be compensated by the same, whereby the use of the previously described Zener or suppression diodes becomes necessary.

The German patent application DE 10 2010 008 815 A1 discloses a device for protecting a semiconductor from over-voltages, wherein the device is only then moved into an active state if the semiconductor switch is turned off. The overvoltage protection is implemented by means of protective circuitry comprising diodes.

A great deal of importance is therefore placed on protecting power semiconductor switches. Hence, there is a need for a reliable overvoltage protection for power semiconductors. There is particularly a need for an overvoltage protection for power semiconductors which is not very dependent on temperature. In addition, there is also a need for an overvoltage protection of power semiconductor switches which has a low tolerance requirement and a high resistance to ageing.

SUMMARY OF THE INVENTION

To this end, the present invention, according to a first aspect thereof, relates to an overvoltage protection circuit for a power semiconductor comprising a first resistor, which is disposed between a first terminal point of the overvoltage protection circuit and a node, a second resistor, which is disposed between the node and a second terminal point of the overvoltage protection circuit, a semiconductor switch comprising a control terminal, an input and an output, wherein the output is connected to the second terminal point of the overvoltage protection circuit, and an overvoltage detector, which is designed to pass over into an at least partially electrically conductive state if a predefined voltage between two terminal s of the overvoltage detector has been exceeded, said overvoltage detector being disposed in a current path between the node and the control terminal of the semiconductor switch.

According to another aspect, the present invention relates to a method for protecting a power semiconductor from over-voltages, comprising the steps: providing a voltage divider comprising a first resistor and a second resistor, which is electrically connected to the first resistor at a node, detecting a voltage at a terminal of the power semiconductor switch by means of the voltage divider, monitoring a voltage at the node of the voltage divider by means of an overvoltage detector, activating a semiconductor switch if the voltage monitored by the overvoltage detector at the node of the voltage divider exceeds a predefined voltage and emitting an overvoltage protection control signal.

The concept underlying the present invention is then that the voltage applied to the power semiconductor switch is detected by means of a voltage divider and a smaller voltage signal which is proportional to the voltage applied to the power semiconductor switch is thereby evaluated. In so doing, the evaluation of the correspondingly smaller voltage signal at the output of the voltage divider is monitored by an overvoltage detector. The overvoltage detector preferably relates to a semiconductor diode which becomes conductive if the predefined voltage is exceeded. By virtue of the fact that the voltage to be monitored has been significantly reduced by means of the voltage divider, a component that is optimized for this lower voltage can be used to monitor an overvoltage that occurs.

While power semiconductor switches, depending on the area of application, are used for voltages in the range of several hundred volts, an overvoltage detector can be used in a significantly smaller voltage range as a result of the reduction of the voltage by means of the voltage divider. Such overvoltage detectors can be obtained at a significantly lower cost. In addition, components can also be used which—independently of the voltage actually applied to the power semiconductor switch—have optimized operating parameters when selecting a suitable overvoltage detector. An overvoltage detector can, for example, be selected which has a particularly low tolerance range. As a result, the response behavior of the overvoltage protection can be improved.

Furthermore, a component can be used as the overvoltage protection which has a low-level dependence on temperature. Because high thermal losses in the form of heat also occur especially when switching large capacities, the temperature fluctuations associated therewith lead to large deviations in the response behavior of conventional protection devices. By optimally selecting suitable overvoltage protection devices, this temperature dependence can be improved.

On account of the adapted response voltage of the corresponding overvoltage protection, the ageing behavior of the overvoltage protection can also furthermore be improved. Due to the reduced voltage range, overvoltage protection components can be used which age significantly less. This leads to considerably smaller safety margins being required when dimensioning the overvoltage protection device according the invention; and therefore the response behavior can be better adapted to the breakdown voltage of the power semiconductor switch being used.

In one embodiment of the overvoltage protection circuit, the overvoltage detector is a Zener diode, a suppression diode or an avalanche diode. Below a predetermined voltage, these components behave initially like a conventional diode. If the voltage applied to such a diode exceeds a predefined limit voltage in reverse direction, such a diode also becomes conductive in reverse direction. Hence, the fact that a predetermined limit voltage has been exceeded can be detected in a simple manner.

In one embodiment, the predefined voltage, at which the overvoltage detector passes into an at least partially electrically conductive state, is less than 10 volts. The predefined voltage, at which the overvoltage detector passes into the conductive state, lies approximately in the range between 5 and 6 volts. Overvoltage detectors, in particular the aforementioned Zener or suppression diodes, having a response voltage in this range can be manufactured especially cost effectively and with very good properties. Such overvoltage detectors have a particularly low tolerance requirement with regard to the response voltage. In addition, the overvoltage detectors also have a low temperature dependence for this voltage range.

In one embodiment, the semiconductor switch is a MOSFET or a bipolar transistor. Such semiconductor switches are particularly well suited to providing an output signal from the signal generated in the overvoltage protection circuit when detecting an over-voltage, said output signal being suitable for protecting the power semiconductor from overvoltages if an admissible voltage is exceeded. Such transistors are particularly well suited to amplifying the signal generated at a relatively low voltage level for detecting an overvoltage into a signal of a higher voltage level.

In one embodiment, the input of the semiconductor switch is connected to the first terminal point of the overvoltage protection circuit. In this case, the input of the semiconductor switch is preferably connected via a diode to the first terminal point of the overvoltage protection circuit.

In an alternative embodiment, the input of the semiconductor switch is connected to a supply voltage of the overvoltage protection circuit. In this way, a particularly stable voltage can be provided for operating the overvoltage protection circuit.

In a further aspect, the present invention relates to a power converter circuit comprising a power semiconductor switch and an inventive overvoltage protection circuit.

In one embodiment, the power converter circuit comprises a plurality of cascaded overvoltage protection circuits.

BRIEF DESCRIPTION OF THE DRAWINGS

Further embodiments and advantages of the present invention ensue from the following description with reference to the attached drawings. In the drawings.

DETAILED DESCRIPTION

Figure 1:
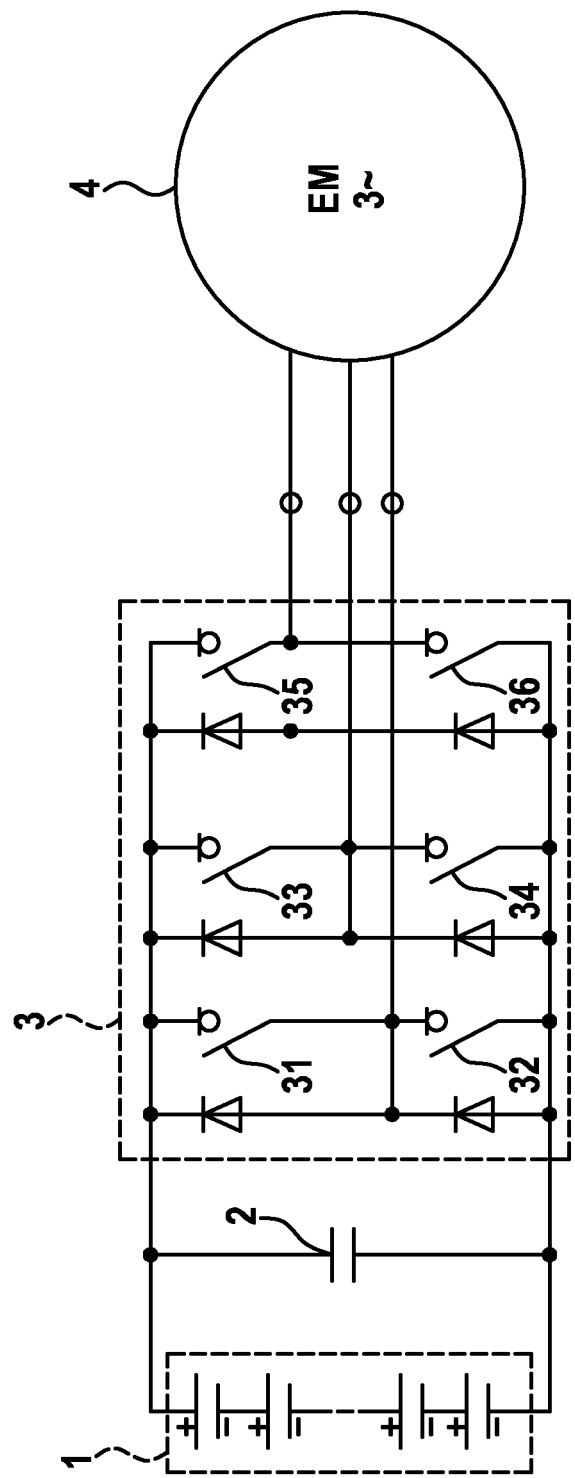
FIG. 1 shows a schematic depiction of a circuit diagram comprising a three-phase power converter circuit.

FIG. 1 shows a basic circuit diagram of a three-phase inverter for a drive system. A DC voltage is initially provided by an electrical storage unit 1, for example a battery. This DC voltage is buffered by a DC-link capacitor 2 and is subsequently supplied to an inverted rectifier 3 (inverter). The inverter 3 converts the supplied DC voltage in such a way that an AC voltage results which is suitable for activating an electrical drive 4.

The inverter 3 comprises six power semiconductor switches 31-36 in the example depicted here. The semiconductor switches 31-36 preferably relate in each case to a MOSFET or an IGBT. In order to protect the power semiconductor switches 31-36, a free-wheeling diode is connected in each case in parallel to each of these components. The overvoltage protection circuit for each of the power semiconductor switches 31-36, which is described in greater detail below, is not depicted in this figure for the sake of clarity.

Although the present invention is described here in connection with a driver circuit for activating a three-phase drive system, which is supplied with current by a DC voltage battery, the invention is not limited to this application. The overvoltage protection circuit described below in greater detail can rather be used for power semiconductor switches in any application area. In this regard, the individual power semiconductor switches which are protected from overvoltages by such an overvoltage protection circuit can be configured in groups comprising a plurality of power semiconductor switches 31-36 as in the case of the previously described three-phase trigger circuit. The inventive overvoltage protection circuit can thus also alternatively be used for an application which has only one single power semiconductor switch.

Figure 2:
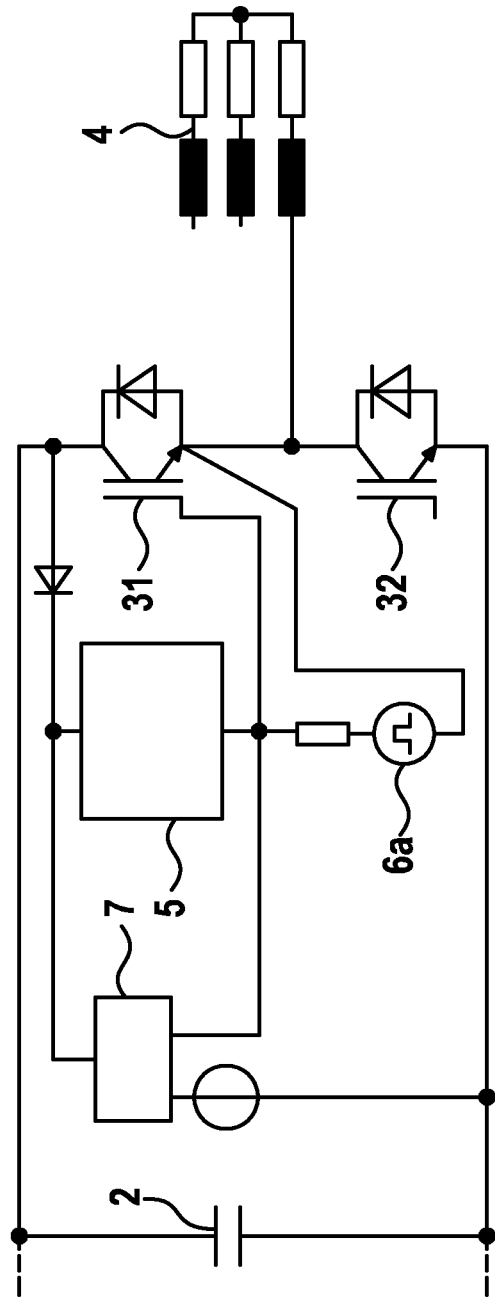
FIG. 2 shows a schematic depiction of a basic circuit diagram of a power converter circuit comprising an overvoltage protection circuit according to a first exemplary embodiment.

FIG. 2 shows a basic circuit diagram for a power converter circuit comprising an overvoltage protection circuit 5. Analogous to the basic circuit diagram depicted in FIG. 1, the power converter circuit is also in this case supplied with current by a battery (not depicted here). In order to buffer the DC voltage supplied, a DC-link capacitor 2 is disposed at the input of the power converter circuit. By means of the two semiconductor switches 31 and 32, the load 4 can be connected to the positive or negative side of the DC-link capacitor. The two power semiconductor switches 31 and 32 are operated in push-pull mode, wherein a certain dead time is however maintained when switching between the modes in order to prevent overlaps in which both power semiconductor switches 31 and 32 are simultaneously conductive.

In the process, the first power semiconductor switch 31 is activated by means of a trigger circuit 6a. A control signal is applied to the control input of the first power semiconductor switch 31 by means of the trigger circuit 6a, whereby the first power semiconductor switch 31 can be closed or at least partially opened.

If the first power semiconductor switch 31 is open, a voltage increase can result for different reasons between the input and the output of the power semiconductor switch 31. In order to prevent damage to the power semiconductor switch 31, the voltage is monitored between input and output of the first power semiconductor switch 31 by the overvoltage protection circuit 5. If the voltage applied to the power semiconductor switch 31 thereby exceeds a predefined value, the overvoltage protection circuit 5 brings the power semiconductor switch 31 into an at least partially electrically conductive state by activating the control input; thus enabling the voltage to again sink between input and output of the power semiconductor switch 31. The function of the overvoltage protection circuit 5 will be described in greater detail below.

In addition, the power converter circuit comprises another controller 7 which can likewise limit the voltage by activating the control input of the power semiconductor switch 31. Said controller has however relatively low dynamics and is therefore not in the position to directly compensate rapidly arising overvoltage spikes.

Figure 3:
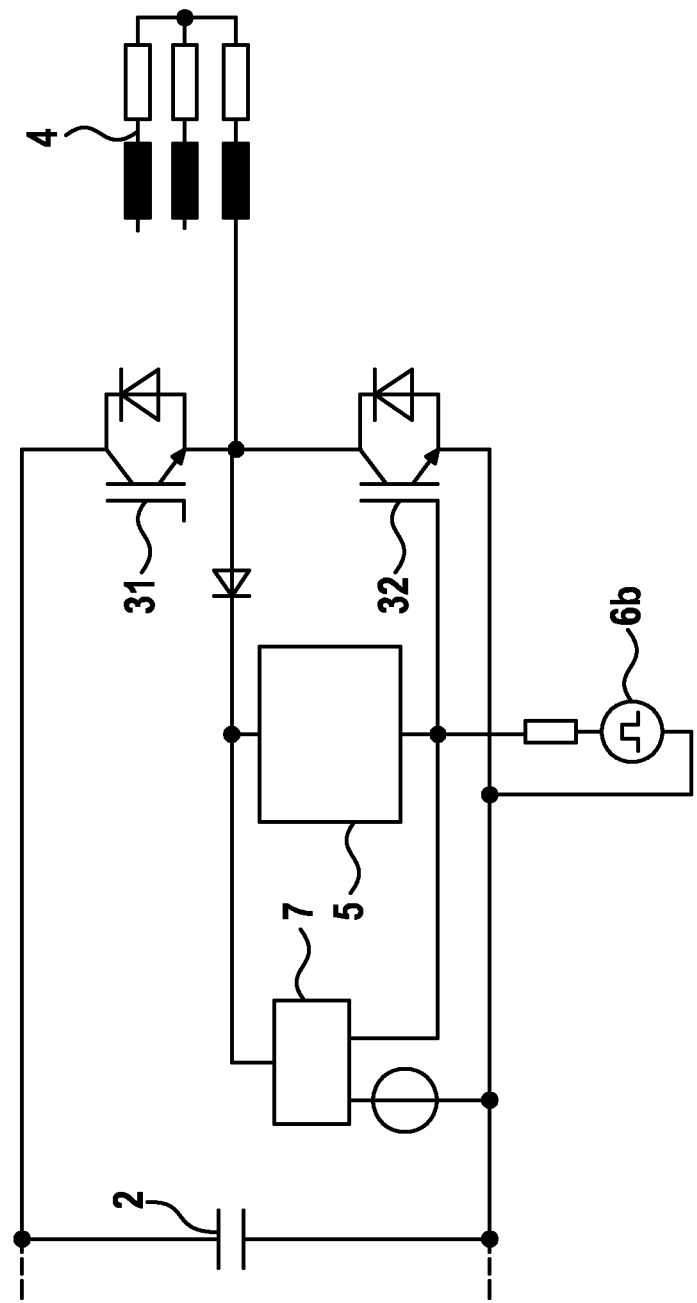
FIG. 3 shows a schematic depiction of a basic circuit diagram of a power converter circuit comprising an overvoltage protection circuit according to a further exemplary embodiment.

FIG. 3 shows a basic circuit diagram of a power converter circuit comprising an overvoltage protection circuit 5 for protecting the second power semiconductor switch 32. The circuit arrangement is constructed analogously to the circuit arrangement of FIG. 2. Each power semiconductor switch 31 and 32 is protected from overvoltage pulses by a corresponding overvoltage protection circuit 5. The isolated depiction of the overvoltage protection circuits 5 for the first power semiconductor switch 31 and the second power semiconductor switch 32 in FIGS. 2 and 3 only serves to provide better clarity.

Figure 4:
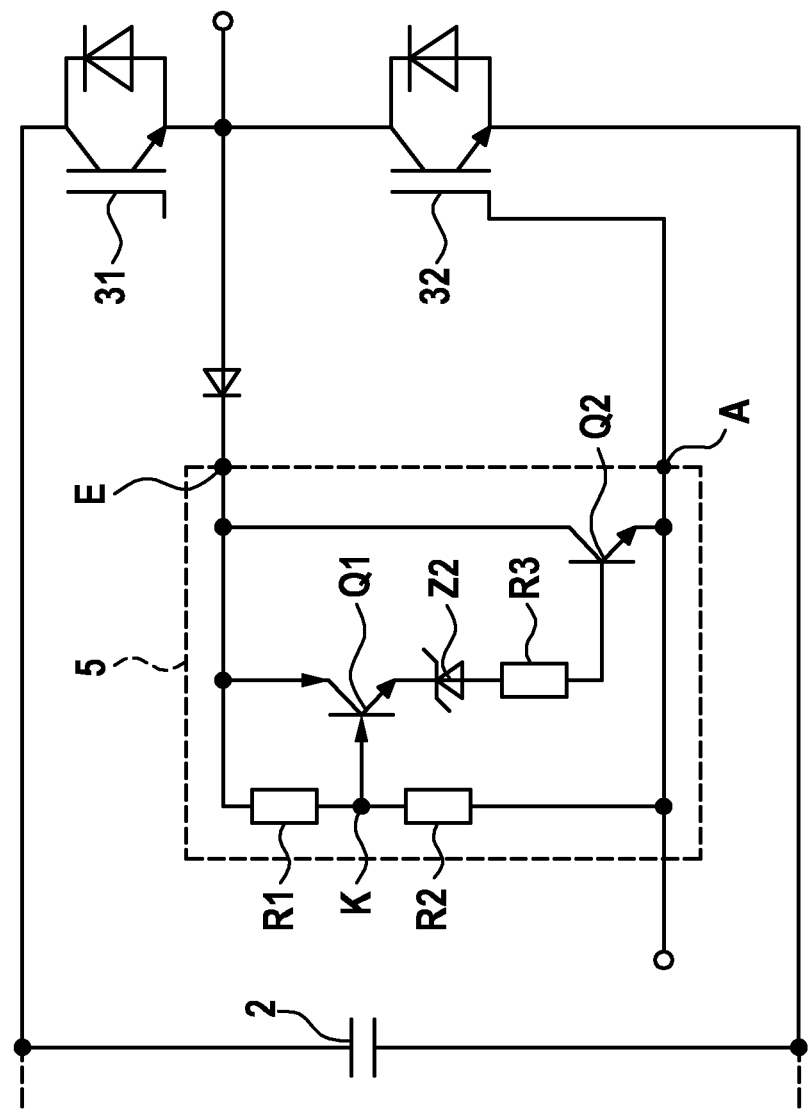
FIG. 4 shows a schematic depiction of a basic circuit diagram of a power converter circuit comprising an overvoltage protection circuit according to an alternative exemplary embodiment.

FIG. 4 shows a schematic depiction of a basic circuit diagram for a power converter circuit comprising an overvoltage protection circuit 5 according to one embodiment of the invention. The overvoltage protection circuit 5 has a first terminal point E and a second terminal point A. The first terminal point E is connected via a diode to the output of the power converter circuit. The second terminal point A is connected to the control terminal of the power semiconductor switch 32. Apart from that, the power converter circuit corresponds to the power converter circuits of the previously described FIGS. 2 and 3.

The overvoltage protection circuit 5 comprises a voltage divider consisting of the two resistors R1 and R2. A first resistor R1 is disposed in this case between the first terminal point E and a node K. A second resistor is disposed between the second terminal point A of the overvoltage protection circuit 5 and the node K. While the voltage of the power semiconductor switch 32 drops across the voltage divider consisting of the two resistors R1 and R2, only a fraction of this voltage is present at the node K in accordance with the ratio of the two resistors R1 and R2. Hence, the voltage between the output of the power converter circuit and the control terminal of the power semiconductor switch 32 is reduced by means of the voltage divider by the factor R1/(R1+R2). The voltage reduced in this manner is applied to the base of the transistor Q1. In the conductive state, this transistor Q1 therefore connects the first terminal point E of the overvoltage protection circuit 5 to a terminal of the Zener diode Z2. The other terminal of said Zener diode Z2 is connected via a further resistor R3 to the base of a further transistor Q1. If the voltage at the resistor R2 exceeds the breakdown voltage of the Zener diode Z2, a current then flows into the base of the transistor Q1 and said transistor becomes conductive. The collector current of said transistor now flows via the transistor Q1 and the Zener diode Z2 into the base of the further transistor Q2. The transistor Q2 therefore also becomes conductive. Hence, a current flows into the control terminal of the power semiconductor switch 32 and switches said power semiconductor switch 32 at least partially on. As a result, the current slope is limited in the power semiconductor switch 32 and the overvoltage between the input and the output of said power semiconductor switch 32 is reduced.

Because, by means of the voltage divider consisting of the two resistors R1 and R2, the voltage potential is considerably reduced across the power semiconductor switch 32 in comparison to the overvoltage, a Zener diode Z2 or a corresponding suppression diode having a reduced breakdown voltage can be used to detect the overvoltage. The breakdown voltage of such a Zener or suppression diode preferably lies under 10 volts, in a particularly preferred manner in a range between 5 and 6 volts. Such diodes are, on the one hand, very reasonably priced and they also demonstrate significantly better operating parameters with regard to response voltage and temperature behavior than is the case with diodes that have a substantially higher detector voltage in the range of 100 or several hundred volts.

Figure 5:
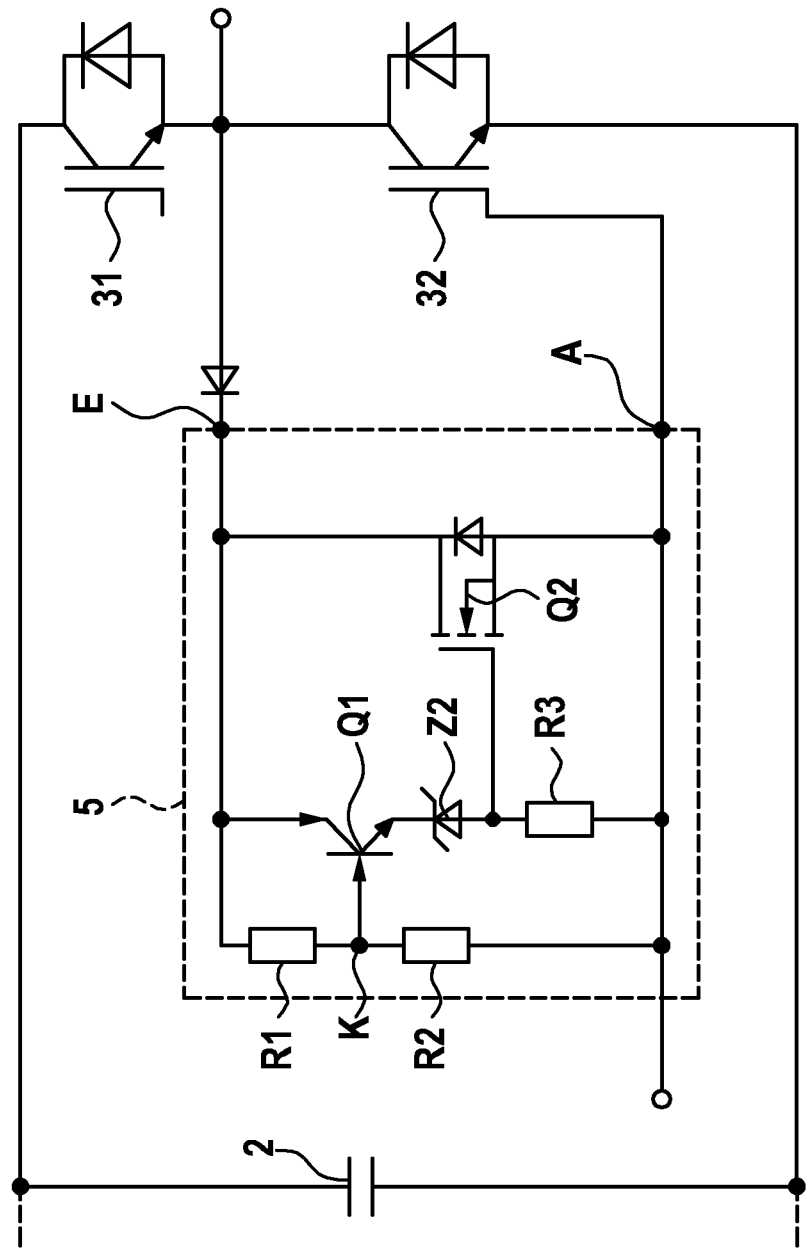
FIG. 5 shows a schematic depiction of an exemplary embodiment of a power converter circuit comprising an overvoltage protection circuit according to yet a further exemplary embodiment.

FIG. 5 shows a basic circuit diagram of a further embodiment of an overvoltage protection circuit 5. The overvoltage protection circuit 5 corresponds substantially to the overvoltage protection circuit 5 of FIG. 4. Only the further transistor Q2 is in this case designed as a MOSFET instead of a bipolar transistor. In addition, the further resistor R3 is disposed in this case between the control terminal of the MOSFET Q2 and the second terminal point A of the overvoltage protection circuit 5.

Figure 6:
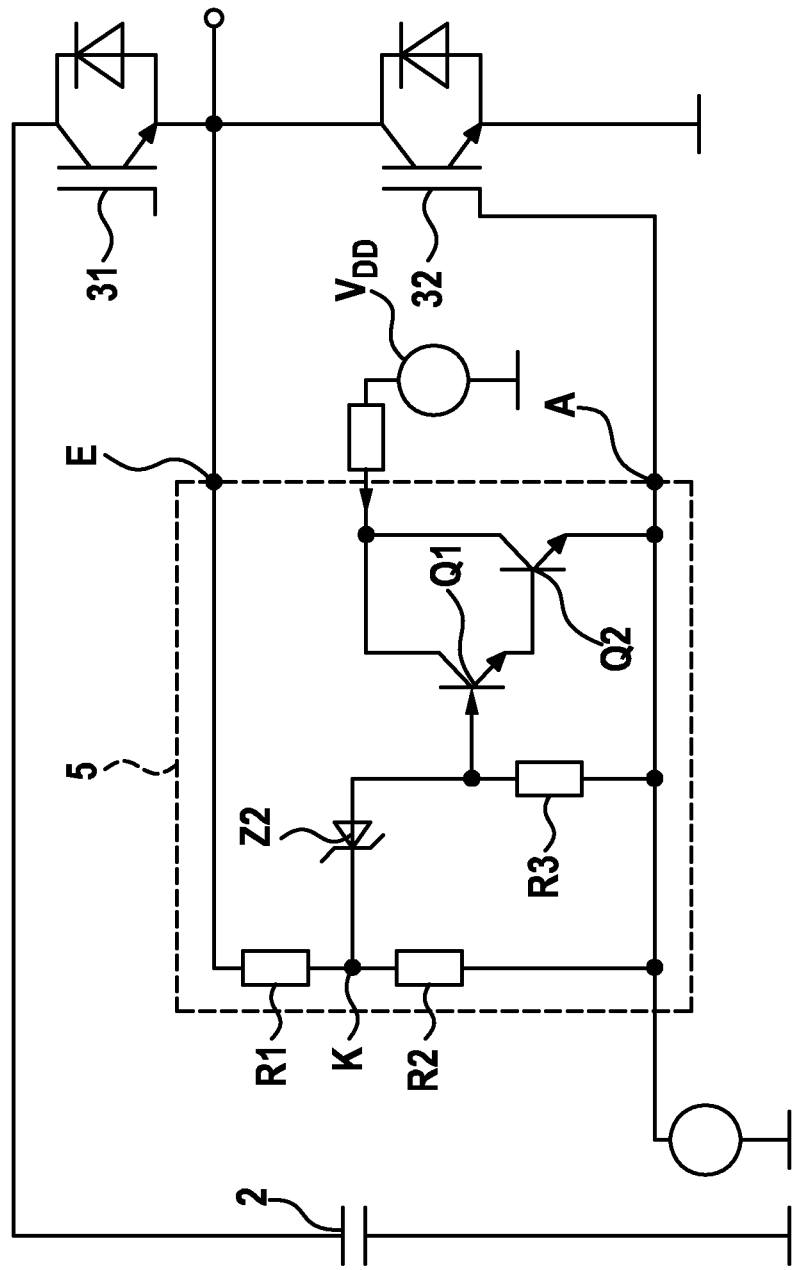
FIG. 6 shows a schematic depiction of a basic circuit diagram of a power converter circuit comprising an overvoltage protection circuit according to a further exemplary embodiment.

FIG. 6 shows a further alternative embodiment of an overvoltage protection circuit 5. In this case, the overvoltage protection circuit 5 has a bipolar Darlington transistor circuit consisting of the two transistors Q1 and Q2. The two bipolar transistors Q1 and Q2 are supplied by a driver supply voltage $V_{DD}$. In this case, the two bipolar transistors Q2 of the Darlington circuit have only a dielectric strength of the driver supply voltage $V_{DD}$. Transistors with favorable technical data, such as, for example, a high current gain, are possible for this voltage class. The resistor disposed between the resistors Q1 and Q2 and the driver supply voltage $V_{DD}$ limits the maximum current flow into the control terminal of the power semiconductor switch 32.

Figure 7:
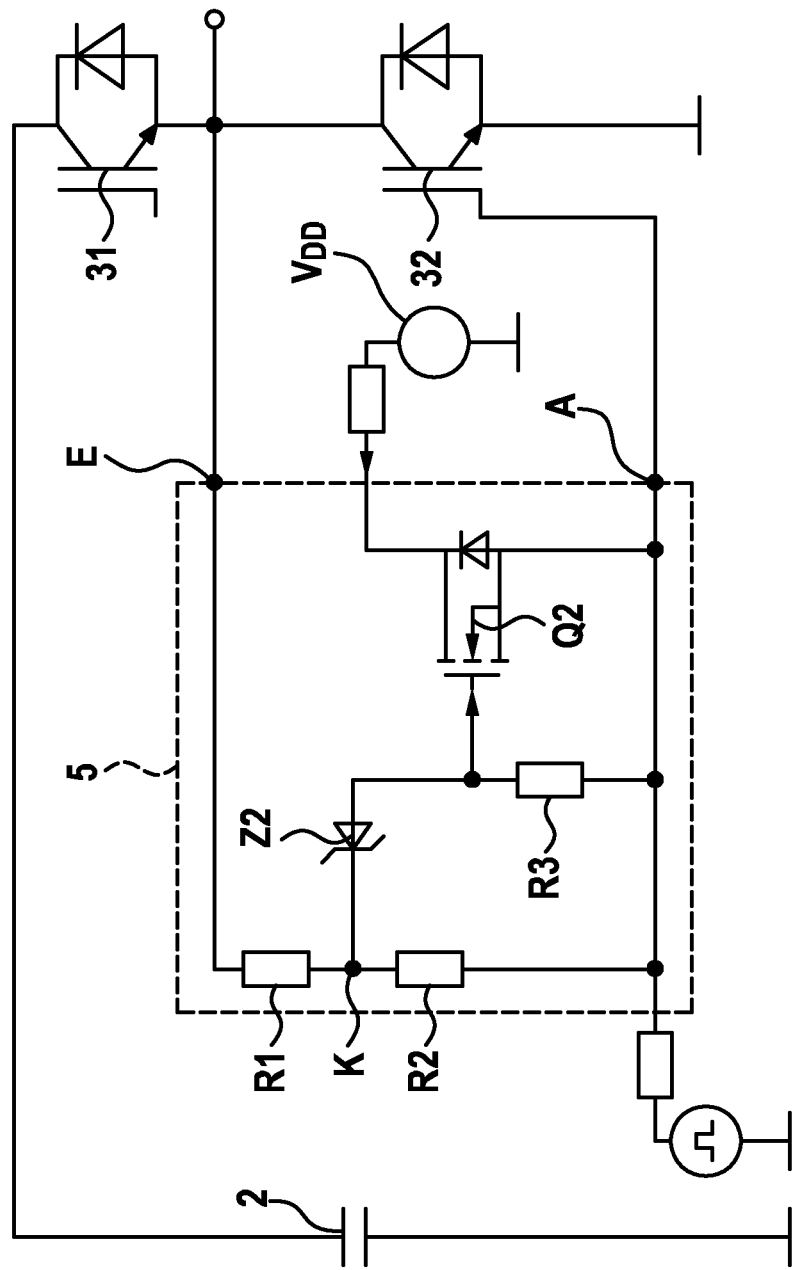
FIG. 7 shows a schematic depiction of a basic circuit diagram for a power converter circuit comprising an overvoltage protection circuit according to an alternative exemplary embodiment.

FIG. 7 shows a corresponding MOSFET variant analogous to FIG. 5; wherein, in FIG. 7, the transistors are supplied by the driver supply voltage $V_{DD}$ analogous to FIG. 6.

Figure 8:
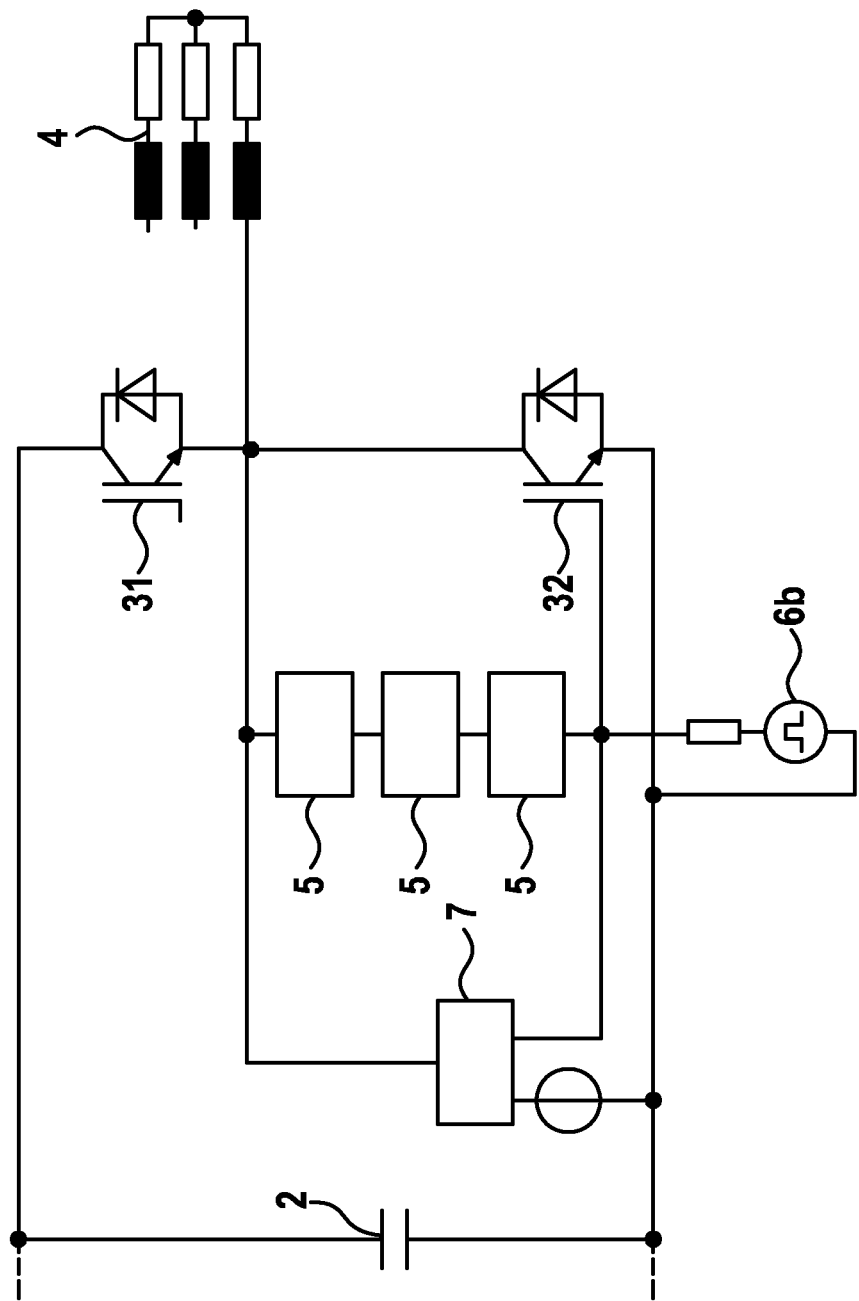
FIG. 8 shows a schematic depiction of a basic circuit diagram of a power converter circuit comprising a cascaded overvoltage protection circuit according to a further exemplary embodiment.

FIG. 8 shows a further embodiment comprising a plurality of cascaded overvoltage protection circuits 5. By cascading a plurality of overvoltage circuits 5, in which the output of an overvoltage protection circuit 5 is connected to an input of a subsequent overvoltage protection circuit 5, the voltage applied to the individual overvoltage protection circuits 5 can be further reduced.

Figure 9:
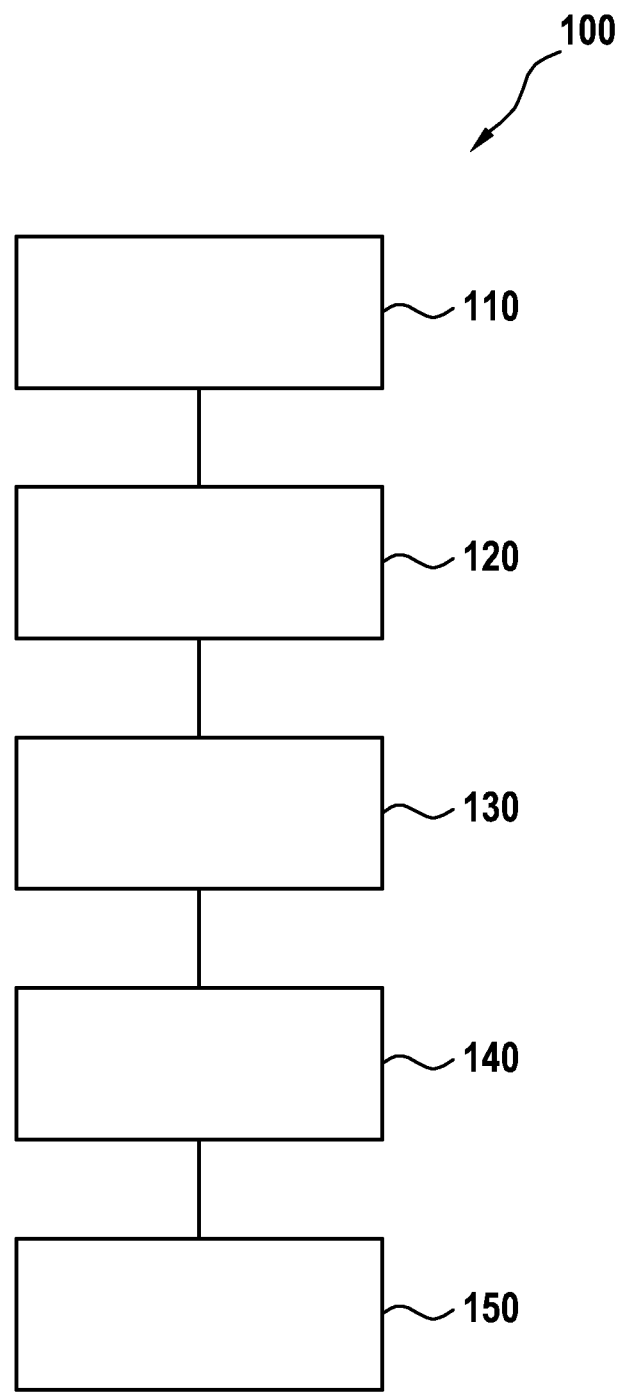
FIG. 9 shows a schematic depiction of a flow diagram for a method as it forms the basis for a further exemplary embodiment of the present invention.

In all of the exemplary embodiments previously described, the overvoltage protection circuit 5 transmits in each case a control signal directly to corresponding power semiconductor switch 31, 32 in order to transfer said power semiconductor switch 31, 32 into an at least partially conductive state. Alternatively, it is also possible that an output signal is first transmitted to the driver circuit by the overvoltage protection circuit 5 and the driver circuit is thereupon induced to activate the corresponding power semiconductor switch 31, 32 in such a manner that said switch passes into an at least partially conductive state. To this end, the overvoltage protection circuit 5 can, for example, emit a corresponding control signal to a suitable integrated circuit, said control signal being evaluated by the integrated circuit in order to activate the power semiconductor switch 31, 32. As an alternative to an integrated circuit, a discretely constructed trigger circuit for activating the power semiconductor switch 31, 32 is, of course, also possible FIG. 9 shows a schematic depiction of a flow diagram for a method 100 for protecting a power semiconductor switch 5 from over-voltages. In step 110, a voltage divider is provided with a first resistor R1 and a second resistor R2, the first resistor R1 and the second resistor R2 being electrically connected to one another at a node K. In step 120, a voltage is detected at a terminal of the power semiconductor switch 31, 32 by the voltage divider. Additionally in step 130, a voltage at the node K of the voltage divider is monitored by an overvoltage detector Z2. If the voltage monitored by the overvoltage detector Z2 exceeds a predefined voltage at the node K of the voltage divider, a semiconductor switch Q2 is activated in step 140. In step 150, an overvoltage protection signal is subsequently emitted. The power semiconductor switch 31, 32 to be monitored can be transferred into an at least partially conductive state by means of said overvoltage protection signal, whereby the overvoltage is reduced at said power semiconductor switch 31, 32.

In summary, the present invention relates to an overvoltage protection circuit and a method for protecting a power semiconductor from over-voltages. For this purpose, a voltage applied across a power semiconductor switch is first converted to a lower voltage signal corresponding to the voltage applied to the power semiconductor switch by means of a resistance voltage divider. The reduced voltage signal is then evaluated by an overvoltage detector, such as a Zener or suppression diode, and the power semiconductor switch to be protected is activated if the response voltage of said diode is exceeded. By lowering the voltage level by means of a voltage divider, a Zener or suppression diode having a lower voltage level can be used for monitoring the over-voltage, said Zener or suppression diode having improved operating properties in comparison with corresponding diodes having a higher voltage level.

The invention claimed is:

1. An overvoltage protection circuit (5) for a power semiconductor switch (31, 32), comprising:
   a first resistor (R1) which is disposed between a first terminal point (E) of the overvoltage protection circuit (5) and a node (K),
   a second resistor (R2) which is disposed between the node (K) and a second terminal point (A) of the overvoltage protection circuit (5),
   a semiconductor switch (Q2) comprising a control terminal, an input and an output, wherein the output is connected to the second terminal point (A) of the overvoltage protection circuit (5), and
   an overvoltage detector (Z2), which is configured to enter an at least partially electrically conductive state if a predefined voltage between two terminals of the overvoltage detector (Z2) is exceeded, wherein the overvoltage detector (Z2) is disposed in a current path between the node (K) and the control terminal of the semiconductor switch (Q2);
   wherein the first connection point (E) of the high-voltage protection circuit (5) is connected to one input of the power semiconductor switch (31, 32) and the second connection point (A) of the high-voltage protection circuit (5) is connected to a control connection of the power semiconductor switch (31, 32), and the second resistor (R2) is arranged between the node (K) and the second connection point (A) of the high-voltage protection circuit (5).

2. The overvoltage protection circuit (5) according to claim 1, wherein the overvoltage detector (Z2) is a Zener diode, a suppression diode or an avalanche diode.

3. The overvoltage protection circuit (5) according to claim 1, wherein the predefined voltage at which the overvoltage detector (Z2) enters the at least partially electrically conductive state is less than 10 volts.

4. The overvoltage protection circuit (5) according to claim 1, wherein the semiconductor switch (Q2) is a MOSFET or a bipolar transistor.

5. The overvoltage protection circuit (5) according to claim 1, wherein the input of the semiconductor switch (Q2) is connected to the terminal point (E) of the overvoltage protection circuit (5).

6. The overvoltage protection circuit (5) according to claim 1, wherein the input of the semiconductor switch (Q2) is connected to a supply voltage ($V_{DD}$) of the overvoltage circuit (5).

7. A power converter circuit, comprising:
   a power semiconductor switch (31, 32); and
   an overvoltage protection circuit (5) according to claim 1.

8. The power converter circuit according to claim 7, wherein the power converter circuit comprises a plurality of cascaded overvoltage protection circuits (5).

9. A method (100) for protecting a power semiconductor (31, 32) from over-voltages, the method comprising:
   providing (110) a voltage divider having a first resistor (R1) and a second resistor (R2), which is electrically connected to the first resistor (R1) at a node (K);
   detecting (120) a voltage at a terminal of the power semiconductor switch (31, 32) by the voltage divider;
   monitoring (130) a voltage at the node (K) of the voltage divider by an overvoltage detector (Z2);
   activating (140) a semiconductor switch (Q2) if the voltage monitored by the overvoltage detector (Z2) at the node (K) of the voltage divider exceeds a predefined voltage; and
   emitting (150) an overvoltage protection control signal at a control connection of the power semiconductor switch (31, 32); and
   wherein the second resistor (R2) is arranged between the node (K) and the second connection point (A) of the high-voltage protection circuit (5) and the second connection point (A) of the high-voltage protection circuit (5) is connected to the control connection of the power semiconductor switch (31, 32).

* * * * *